United States Patent [19]

Hosoda et al.

[11] Patent Number: 5,738,968
[45] Date of Patent: Apr. 14, 1998

[54] POSITIVE PHOTORESIST COMPOSITION

[75] Inventors: Hiroshi Hosoda; Taku Hirayama; Kousuke Doi; Satoshi Niikura; Hidekatsu Kohara; Toshimasa Nakayama, all of Kanagawa, Japan

[73] Assignee: Tokyo Ohka Kogyo Co., Ltd., Kanagawa, Japan

[21] Appl. No.: 823,585

[22] Filed: Mar. 25, 1997

[30] Foreign Application Priority Data

Mar. 25, 1996 [JP] Japan .................................. 8-092997
Jul. 2, 1996 [JP] Japan .................................. 8-191432

[51] Int. Cl.$^6$ .................................................. G03F 7/023
[52] U.S. Cl. .............................. 430/191; 430/192; 430/193
[58] Field of Search ........................................ 430/191, 192, 430/193

[56] References Cited

U.S. PATENT DOCUMENTS

| | | | |
|---|---|---|---|
| 4,377,631 | 3/1983 | Toukhy et al. | 430/192 |
| 5,215,856 | 6/1993 | Jayaraman | 403/191 |
| 5,290,658 | 3/1994 | Uenishi et al. | 430/192 |
| 5,407,780 | 4/1995 | Hioki et al. | 430/192 |
| 5,424,167 | 6/1995 | Uetani et al. | 430/191 |
| 5,456,995 | 10/1995 | Ozaki et al. | 430/191 |
| 5,456,996 | 10/1995 | Ozaki et al. | 430/191 |
| 5,468,590 | 11/1995 | Hashimoto et al. | 430/191 |
| 5,601,961 | 2/1997 | Nakayama et al. | 430/191 |
| 5,620,828 | 4/1997 | Tan et al. | 430/191 |

FOREIGN PATENT DOCUMENTS

| | | |
|---|---|---|
| 5-88363 | 4/1983 | Japan . |
| 4-11260 | 1/1992 | Japan . |
| 4-293050 | 1/1992 | Japan . |
| 6-59447 | 3/1993 | Japan . |
| 5-88362 | 4/1993 | Japan . |
| 5-127375 | 5/1995 | Japan . |

*Primary Examiner*—John S. Chu
*Attorney, Agent, or Firm*—Sughrue, Mion, Zinn, Macpeak & Seas, PLLC

[57] ABSTRACT

The present invention provides a positive photoresist composition exhibiting superior sensitivity, definition and thermostability, and in addition, having excellent focal depth range properties. The positive photoresist composition comprises (A) an alkali-soluble resin; (B) a quinonediazide group-containing compound; and (C), for example, bis(4-hydroxy-2,3,5-trimethylphenyl)-2-hydroxyphenylmethane.

8 Claims, No Drawings

POSITIVE PHOTORESIST COMPOSITION

BACKGROUND OF THE INVENTION

1. Field of the Invention

The present invention relates to positive photoresist compositions, and more specifically, relates to a positive photoresist composition which is useful for manufacture of semiconductor devices and liquid crystal displaying devices.

2. Description of the Related Art

Hitherto, in manufacture of semiconductor devices such as IC's and LSI's and liquid crystal devices such as LCD's, photolithography has been employed to form a pattern on a substrate. In the photolithographic process, a photoresist is applied onto a substrate such as a silicon wafer or a glass plate using a spinner or the like, and dried; subsequently, a latent image is formed by irradiating or scanning the substrate through a mask with an active beam or a corpuscular beam; and the object pattern is formed on the substrate by developing the latent image. Several resist compositions having superior definition were developed and proposed for photolithography. In particular, positive photoresist compositions containing a soluble novolak resin and a quinonediazide group-containing compound are preferred.

Novolak resins can be dissolved in alkaline solutions without swelling, thus have excellent developing properties, and exhibit excellent heat-resistances against plasma etching. On the other hand, quinonediazide group-containing compounds exhibit an inhibitory activity against the alkaline-solubility of novolak resins while they themselves change to be alkali-soluble and also change to enhance alkaline-solubilities of the novolak resins when they are irradiated or scanned with electromagnetic waves such as ultraviolet rays (e.g. g ray or i ray) or far ultraviolet rays including an excimer laser beam, or with corpuscular rays such as an electron beam.

Meanwhile, in recent years, positive photoresist compositions are required to satisfy several requirements such as thermostability, high definition and excellent shape-profiling ability. Accordingly, much research was conducted and several positive photoresist compositions were proposed as disclosed in, for example, the specification of U.S. Pat. No. 4,377,631, Japanese Patent Laid-Open Nos. 62-35349, 1-142548 and 1-179147, and Japanese Patent Publication No. 3-4897.

Such positive photoresist compositions as disclosed in the above publications, however, do not possess properties coping with requirements such as thermostability, high definition and high shape-profiling ability which had arisen from an increasing demand for finer semiconductor devices, and therefore, there was a strong demand for improving their properties. Under such circumstances, several photoresist compositions have been proposed for satisfying such requirements. For example, Japanese Patent Laid-Open No. 2-275955 discloses a photoresist composition to which polyphenols such as bis(2,5-dimethyl-4-hydroxyphenyl)-2-hydroxyphenylmethane and bis(3,5-dimethyl-4-hydroxyphenyl)-2-hydroxyphenylmethane are added.

The photoresist composition disclosed in the above publication is, however, still unsatisfactory in sensitivity and definition needed to cope with much finer semiconductor devices, inferior in thermostability needed during heating treatment such as dry etching or FEB (Post Exposure Bake) performed after radiation and before development; and in addition, insufficient in focal depth range properties. Accordingly, there is strong demand for positive photoresist compositions improved and well-balanced in such properties.

SUMMARY OF THE INVENTION

Following the above-described view points, the inventors earnestly conducted several investigations, and found that a positive photoresist having high sensitivity, high definition, superior thermostability, and excellent focal depth range properties can be obtained by using a specific polyhydroxy compound in combination with a positive photoresist composition comprising an alkali-soluble resin and a quinonediazide group-containing compound. Further, the inventors found that a positive photoresist composition in which the above-described characteristics and properties can be further improved by using an esterified compound of a specific polyhydroxy compound and naphthoquinonediazidesulfonic acid as the quinonediazide group-containing compound, and have accomplished the present invention.

Accordingly, an object of the present invention is to provide a positive photoresist composition which has high sensitivity, high definition, and superior thermostability.

In addition, another object of the present invention is to provide a positive photoresist composition which has excellent focal depth range properties in addition to the above-described desirable characteristics.

Specifically, the present invention to achieve the above-described objects provides a positive photoresist composition comprising:

(A) an alkali-soluble resin;

(B) a quinonediazide group-containing compound; and (C) at least one compound selected from the group consisting of bis(4-hydroxy-2,3,5-trimethylphenyl)-2-hydroxyphenylmethane, bis(4-hydroxy-2,3,5-trimethylphenyl)-4-hydroxyphenylmethane, bis(4-hydroxy-2,3,5-trimethylphenyl)-3-hydroxyphenylmethane, bis(4-hydroxy-2,3,5-trimethylphenyl)-3,4-dihydroxyphenylmethane, and bis(4-hydroxy-2,3,5-trimethylphenyl)-4-hydroxy-3-methoxyphenylmethane.

DETAILED DESCRIPTION OF THE INVENTION

The alkali-soluble resin (A) to be used in the present invention can be selected from phenol resins, hydroxystyrene polymers and derivatives thereof, and acryl resins or copolymers of styrene and acrylic acid which are known as coating resins used for positive photoresist compositions.

The aforementioned phenol resins may include condensation products of phenol compounds with aldehyde compounds; condensation products of phenol compounds with ketone compounds; and hydrogenated products of the aforementioned phenol resins. In particular, phenol-novolak resins and cresol-novolak resins are preferred since they have satisfactory developing properties and plasma resistances. Examples of the above-mentioned phenol compounds include monohydric phenol compounds such as phenol, m-cresol, p-cresol, 2,3-xylenol, 2,5-xylenol, 2,6-xylenol, 3,5-xylenol, 2,3,5-trimethylphenol, ethylphenol, propylphenol, butylphenol, and phenylphenol; and polyhydric phenol compounds such as resorcinol, pyrocatechol, hydroquinone, bisphenol A, and pyrogallol. Meanwhile, examples of aldehyde compounds include formaldehyde, acetaldehyde, benzaldehyde, hydroxybenzaldehyde, and terephthalaldehyde. Further, examples of ketone compounds include acetone, methyl ethyl ketone, diethyl ketone, and diphenyl ketone. An objective phenol resin may be synthesized by reacting a mixture comprising one or more of the above-described phenol compounds with a mixture comprising one or more of the above-described aldehyde or ketone compounds in the presence of an acid catalyst such as hydrochloric acid, sulfuric acid, p-toluenesulfonic acid, formic acid, oxalic acid, or the like according to an ordinary method. An objective hydrogenated product of a phenol resin may be prepared by dissolving a resin in an organic solvent, and introducing hydrogen in a homogeneous or heterogeneous system in the presence of a hydrogenation catalyst. In particular, novolak resins are suitable, and they can be obtained by a condensation reaction between formaldehyde and a mixture of a few phenol compounds selected from the group consisting of m-cresol, p-cresol, 2,5-xylenol, 3,5-xylenol, and 2,3,5-trimethylphenol.

Examples of the above-mentioned hydroxystyrene polymers and derivatives thereof include hydroxystyrene homopolymers; and copolymers of hydroxystyrene with a compound co-polymerizable with hydroxystyrene such as acrylic acid derivatives, methacrylic acid derivatives, styrene derivatives, maleic anhydride, vinyl acetate, and acrylonitrile. Further, commercially available alkali-soluble resins can be used as the above-mentioned acryl resins or copolymers of styrene and acrylic acid.

As to the molecular weight of the alkali-soluble resin, the weight average molecular weight according to gel permeation chromatography may fall within a range from 1,000 to 30,000, and preferably, from 2,000 to 25,000. According to the above Mw range, improved pattern shape and definition may be obtained.

As a quinonediazide group-containing compound (B), completely or partially esterified compounds of hydroxy compounds with quinonediazide sulfonic acid can be used. The hydroxy compounds may include (i) polyhydroxybenzophenone compounds; (ii) hydroxyaryl compounds; (iii) bis(hydroxyphenyl)alkane compounds; and (iv) phenol compounds.

More specifically, examples of polyhydroxybenzophenone compounds (i) include 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, and 2,3,3',4,4',5'-hexahydroxybenzophenone.

Examples of hydroxyaryl compounds (ii) include compounds expressed by the following general formula 1.

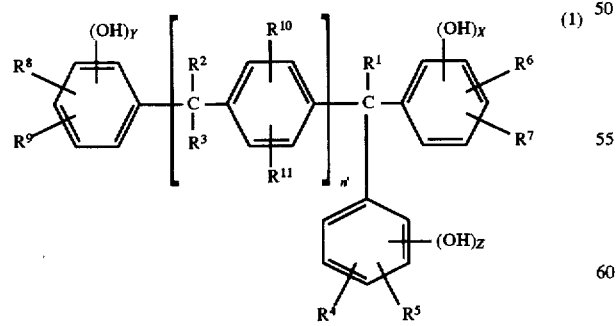

(In the above formula, each of $R^1$ to $R^3$ is independently a hydrogen atom or a lower alkyl group having carbon atoms of 4 or less; each of $R^4$ to $R^9$ is independently a hydrogen atom, a halogen atom, a lower alkyl group having carbon atoms of 4 or less, a lower alkoxy group having carbon atoms of 4 or less, or a lower alkenyl having carbon atoms of 4 or less or cycloalkyl group having carbon atoms of 5 to 8; each of $R^{10}$ and $R^{11}$ is independently a hydrogen atom, a halogen atom, or a lower alkyl group having carbon atoms of 4 or less; each of x, y, and z is independently an integer 1, 2, or 3; and n' is 0 or 1.) Practical examples of such compounds include tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-3-hydroxyphenylmethane, bis(4-hydroxy-2,5-dimethylphenyl)-4-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(5-cyclohexyl-2-hydroxy-4-methylphenyl)-2-hydroxyphenylmethane, bis(5-cyclohexyl-2-hydroxy-4-methylphenyl)-4-hydroxyphenylmethane, bis(5-cyclohexyl-2-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene.

Further, examples of hydroxyaryl compounds (ii) also include compounds expressed by the following general formula 2.

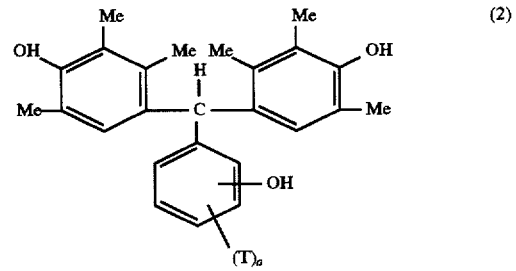

(In the above formula, T indicates a methoxy group or a hydroxyl group; and a is an integer 0 or 1.) Practical examples of such compounds include bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, and bis(4-hydroxy-2,3,5-trimethylphenyl)-4-hydroxy-3-methoxyphenylmethane.

As to bis(hydroxyphenyl)alkane compounds (iii), examples include compounds expressed by the following general formula 3.

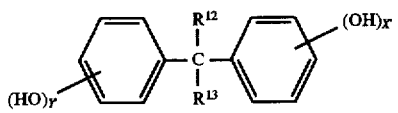

(In the above formula, each of $R^{12}$ and $R^{13}$ is independently a hydrogen atom or a lower alkyl group having carbon atoms of 4 or less; and each of X' and Y' is independently an integer 1,2 or 3.) Practical examples of such compounds include 2-(2,3,4-trihydroxyphenyl)-2-(2',3',4'-trihydroxyphenyl) propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl) methane, and bis(2,4-dihydroxyphenyl)methane.

As to phenol compounds (iv), examples include phenol, p-methoxyphenol, dimethylphenol, hydroquinone, naphthol, pyrocatechol, pyrogallol monomethyl ether, pyrogallol-1,3-dimethyl ether, gallic acid, partially esterified gallic acid, and partially etherified gallic acid.

Quinonediazide group-containing compounds may be esterified compounds of quinonediazidesulfonic acids with the above-described hydroxy compounds, and examples of quinonediazidesulfonic acids as the acid portions of such esterified compounds include benzoquinone-1,2-diazide-4-sulfonic acid, naphthoquinone-1,2-diazide-4-sulfonic acid, naphthoquinone-1,2-diazide-5-sulfonic acid, and sulfonic acids of other quinonediazide derivatives. In particular, naphthoquinone-1,2-diazide-4(or 5)-sulfonic acid is preferred. In preparing the above-described quinonediazide group-containing compounds, for example, predetermined amounts of at least one of the above-described polyhydroxy compounds and at least one naphthoquinonediazidesulfonyl compound such as 1,2-naphthoquinonediazide-4(or 5)-sulfonyl halide are dissolved in an organic solvent such as dioxane, N-methylpyrrolidone, dimethylacetamide, dimethylformamide, and tetrahydrofuran, and esterified in the presence of an alkaline catalyst such as triethanolamine, triethylamine, pyridine, alkali carbonate, and alkali hydrogencarbonate to synthesize an objective quinonediazide group-containing compound. The esterifying reaction is preferably carried out so as to achieve an esterification degree of 50% or more, and more preferably, 60% or more relative to the total mole number of the hydroxyl groups in the hydroxy compound. High definition cannot be achieved with an esterification degree of below 50%. Among the above-described quinonediazide group-containing compounds, esterified compounds of naphthoquinone-1,2-diazidesulfonic acid with hydroxyaryl compounds expressed by the general formula 2 are preferred since further excellent focal depth range properties can be achieved by using such esterified compounds together with ingredient (C). Particularly suitable are esterified compounds of naphthoquinonediazidesulfonic acid with bis(4-hydroxy-2,3,5-trimethylphenyl)-2-hydroxyphenylmethane.

Ingredient (B) may be contained in a range of 1 to 50 parts by weight, and preferably, 5 to 35 parts by weight relative to 100 parts by weight of the total of the ingredients (A) and (C). With below 1 part by weight of the ingredient (B), the objective image pattern cannot be formed. Meanwhile, with above 50 parts by weight of the ingredient (C), definition and the shape of the resist pattern will deteriorate, and in addition, sensitivity will be reduced.

As mentioned above, the positive photoresist composition of the present invention also contains the ingredient (C) in addition to the ingredients (A) and (C). The ingredient (C) may comprise at least one compound selected from the group consisting of bis(4-hydroxy-2,3,5-trimethylphenyl)-2-hydroxyphenylmethane, bis(4-hydroxy-2,3,5-trimethylphenyl)-4-hydroxyphenylmethane, bis(4-hydroxy-2,3,5-trimethylphenyl)-3-hydroxyphenylmethane, bis(4-hydroxy-2,3,5-trimethylphenyl)-3,4-dihydroxyphenylmethane, and bis(4-hydroxy-2,3,5-trimethylphenyl)-4-hydroxy-3-methoxyphenylmethane, namely, the polyhydroxy compounds expressed by the following general formulae 4 to 8.

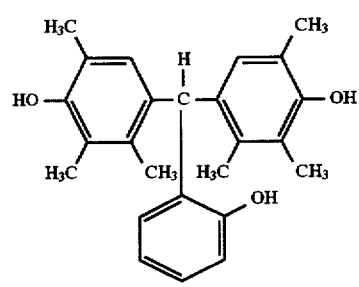

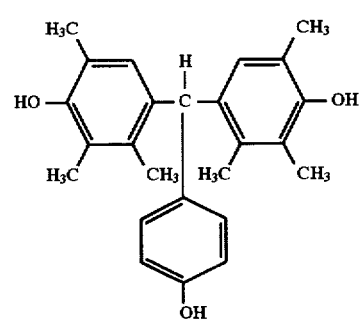

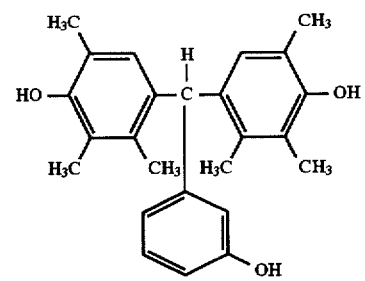

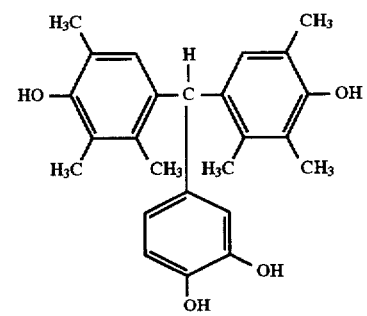

-continued

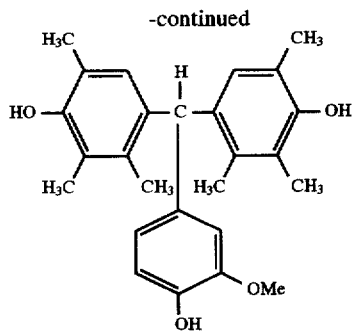

(8)

Due to containing such a polyhydroxy compound, the positive photoresist according to the present invention can exhibit improved sensitivity, definition and thermostability, and in addition, possess excellent focal depth range properties. In particular, bis(4-hydroxy-2,3,5-trimethylphenyl)-2-hydroxyphenylmethane is preferred.

The ingredient (C) may be contained in a range of 5 to 100 parts by weight, and preferably, 10 to 50 parts by weight relative to 100 parts by weight of the ingredient (A). With below 5 parts by weight of the ingredient (C), the effect of the added ingredient (C) is not exhibited. Meanwhile, with above 100 parts by weight of the ingredient (C), definition and the shape of the resist pattern will deteriorate, and in addition, crystallization occurs which decrease storage stability.

In addition to the above-described ingredients, the positive photoresist composition of the present invention may further contain one or more additives within a range in which the object of the present invention is not hindered. Such additives are, for example, miscible additives; ultraviolet absorbents for preventing halation such as 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene, and curcumin; surfactants for preventing striation, especially fluorine-based surfactants such as Florade FC-430 and FC-431 (manufactured by Sumitomo 3M Ltd.), and FTOP EF122A, EF122B, EF122C and EF126 (manufactured by Tochem Products Corporation). As occasion demands, the photoresist composition of the present invention may further contain other ordinarily-used additives such as additional resins, plasticizers, stabilizers, coloring agents, sensitizers, and contrast-enhancing agents within a range in which the desirable performances of the composition do not deteriorate.

The composition of the present invention is preferably used in the form of a coating solution using an organic solvent for dissolution of the ingredients, as in the resist pattern forming process according to the conventional photoresist technique. Examples of organic solvents include ketone compounds such as acetone, methyl ethyl ketone, cyclohexanone, methyl isoamyl ketone, 2-heptanone; alcohols and derivatives thereof such as ethylene glycol, propylene glycol, diethylene glycol, ethylene glycol monoacetate, propylene glycol monoacetate, diethylene glycol monoacetate, monomethyl ether thereof, monoethyl ether thereof, monopropyl ether thereof, monobutyl ether thereof, and monophenyl ether thereof; cyclic ether compounds such as dioxane; and ester compounds such as methyl lactate, ethyl lactate, methyl acetate, ethyl acetate, butyl acetate, methyl pyruvate, ethyl pyruvate, methyl methoxypropionate, and ethyl ethoxypropionate. Each of these organic solvents may be used solely or in combination with the others. The composition of the present invention is used, for example, in the following manner. Initially, a substrate such as a silicon wafer or glass plate is coated using a spinner or the like with a coating solution which is prepared by dissolving the ingredients in a solvent as described above. Secondly, the resultant is dried to form a photosensitive layer, and then subjected to exposure through a desired mask pattern, for example, by irradiation with electromagnetic wave such as ultraviolet rays (i ray, g ray and the like), far ultraviolet rays, excimer laser beams, or X-rays, or by scanning irradiation with corpuscular beams such as electron beams. Subsequently, the exposed portions are selectively dissolved and removed by dipping the resultant in a developing solution, for example, an aqueous alkaline solution such as containing 1 to 10% by weight of tetramethylammonium hydroxide to obtain an image faithful to the mask pattern.

The above-illustrated pattern-forming process can be applied not only to producing semiconductor devices or liquid crystal displaying devices but also to other various fields requiring lithographic processes, such as LCD, TAB, PCB, chemical mealing, and printing.

EXAMPLES

The present invention is further illustrated in detail with examples below but is not limited thereto.

Incidentally, the values shown in the examples and comparative examples below were measured according to the following methods.

(1) Sensitivity

Each sample was applied to a silicon wafer using a spinner, and dried on a hot plate at 90° C. for 90 sec. to obtain a resist film having a thickness of 1.05 µm. The resist film thus obtained was then subjected to exposures through a mask pattern with time periods from 0.1 sec. to 0.001 sec. using a reducing projection aligner NSR-2005i10D (manufactured by Nikon Corporation, NA=0.57). Subsequently, the resultant was developed in an aqueous solution containing 2.38% by weight of tetramethylammonium hydroxide at 23° C. for 60 sec., and dried after washing with water for 30 sec. The exposure time period (ms) required for achieving a width ratio of 1:1 in replicating 0.45 µm wide lines and spaces of the above-obtained resist pattern was regarded as the index of sensitivity.

(2) Definition

The maximum resolution at the exposure value required for replicating a mask pattern of 0.5 µm in width is regarded as the index of definition.

(3) Thermostability

A resist pattern comprising lines of 5 µm in width was formed on a silicon wafer, and heated on a hot plate at temperatures starting from 125° C. and increasing by additions of 5° C. At each temperature, baking was performed for 5 min. The maximum temperature not causing deformation of the resist pattern was regarded as the index of thermostability.

(4) Focal Depth Range I

On each sample, resist patterns were formed by performing exposure with different focal points and developments, wherein a reducing projection aligner NSR-2005i10D (manufactured by Nikon Corporation, NA=0.57) was used, and each exposure was performed with a standard exposure value of Eop (the exposure value required for achieving a width ratio of 1:1 in replicating 0.45 µm wide lines and spaces of the mask pattern). The resist patterns thus obtained were then observed through SEM photographs, and the focal points with which 0.45 μm rectangular resist patterns could be obtained were examined. The maximum diiference (μm) in such focal points was regarded as the focal depth range I.

(5) Focal Depth Range II

In a manner similar to that for the focal depth range 1, the focal points with which 0.40 μm rectangular resist patterns could be obtained were examined. The maximum difference (μm) in such focal points was regarded as the focal depth range II.

(6) Focal Depth Range III

In a manner similar to that for the focal depth range 1, the focal points with which 0.38 μm rectangular resist patterns could be obtained were examined. The maximum difference (μm) in such focal points was regarded as the focal depth range III.

(7) Focal Depth Range IV

In a manner similar to that for the focal depth range 1, the focal points with which 0.35 μm rectangular resist patterns could be obtained were examined. The maximum difference (μm) in such focal points was regarded as the focal depth range IV.

EXAMPLE 1

A mixture was prepared by mixing m-cresol and p-cresol in a mole ratio of 4:6. Formalin was then added to this mixture, and condensation was carried out in the presence of an oxalic acid catalyst according to an ordinary method. The alkali-soluble novolak resin thus obtained, which had a weight average molecular weight of 8,000, was subjected to removal of the low molecule fractions to obtain an alkali-soluble novolak resin having a weight average molecular weight of 10,000. Subsequently, 100 parts by weight of this novolak resin; 30 parts by weight of a photosensitive ingredient, namely, an esterified compound prepared by reacting bis(4-hydroxy-3,5-dimethylphenyl)-2-hydroxyphenylmethane with naphthoquinone-1,2-diazide-5-sulfonyl chloride in a mole ratio of 1:2.5; and 20 parts by weight of bis(4-hydroxy-2,3,5-trimethylphenyl)-2-hydroxyphenylmethane were dissolved in a mixture solvent comprising 360 parts by weight of ethyl lactate and 40 parts by weight of butyl acetate. The resulting solution was then filtered with a membrane filter having a pore size of 0.2 μm to obtain a coating solution of a positive photoresist composition.

A coating film was formed using the above-prepared coating solution, and subjected to evaluation of sensitivity, delinition, thermostability, and focal depth range properties (focal depth ranges I to IV). The results are shown in Table 1.

EXAMPLE 2

A coating solution was prepared in the same manner as in Example 1 except that bis(4-hydroxy-2,3,5-trimethylphenyl)-3,4-dihydroxyphenylmethane was used instead of bis(4-hydroxy-2,3,5-trimethylphenyl)-2-hydroxyphenylmethane. A coating film was formed using the above-prepared coating solution, and subjected to evaluation of sensitivity, definition, thermostability, and focal depth range properties. The results are shown in Table 1.

COMPARATIVE EXAMPLE 1

A coating solution was prepared in the same manner as in Example 1 except that bis(4-hydroxy-2,5-dimethylphenyl)-2-hydroxyphenylmethane was used instead of bis(4-hydroxy-2,3,5-trimethylphenyl) -2-hydroxyphenylmethane. A coating film was formed using the above-prepared coating solution, and subjected to evaluation of sensitivity, definition, thermostability, and focal depth range properties. The results are shown in Table 1.

COMPARATIVE EXAMPLE 2

A coating solution was prepared in the same manner as in Example 1 except that bis(4-hydroxy-3,5-dimethylphenyl)-2-hydroxyphenylmethane was used instead of bis(4-hydroxy-2,3,5-trimethylphenyl)-2-hydroxyphenylmethane. A coating film was formed using the above-prepared coating solution, and subjected to evaluation of sensitivity, definition, thermostability, and focal depth range properties. The results are shown in Table 1.

EXAMPLE 3

A coating solution was prepared in the same manner as in Example 1 except that bis(4-hydroxy-2,3,5-trimethylphenyl)-3-hydroxyphenylmethane was used instead of bis(4-hydroxy-2,3,5-trimethylphenyl)-2-hydroxyphenylmethane. A coating film was formed using the above-prepared coating solution, and subjected to evaluation of sensitivity, definition, thermostability, and focal depth range properties. The results are shown in Table 1.

EXAMPLE 4

A coating solution was prepared in the same manner as in Example 1 except that bis(4-hydroxy-2,3,5-trimethylphenyl)-4-hydroxyphenylmethane was used instead of bis(4-hydroxy-2,3,5-trimethylphenyl)-2-hydroxyphenylmethane. A coating film was formed using the above-prepared coating solution, and subjected to evaluation of sensitivity, definition, thermostability, and focal depth range properties. The results are shown in Table 1.

EXAMPLE 5

A coating solution was prepared in the same manner as in Example 1 except that 30 parts by weight of the photosensitive ingredient was changed to 27 parts by weight of an esterified compound prepared by reacting bis(4-hydroxy-2,3,5-trimethylphenyl)-2-hydroxyphenylmethane with naphthoquinone-1,2-diazide-5-sulfonyl chloride in a mole ratio of 1:2.0, and the amount of bis(4-hydroxy-2,3,5-trimethylphenyl)-2-hydroxyphenylmethane was changed to 25 parts by weight. A coating film was formed using the above-prepared coating solution, and subjected to evaluation of sensitivity, definition, thermostability, and focal depth range properties. The results are shown in Table 1.

TABLE 1

|  | Sensitivity (ms) | Definition (μm) | Thermo-stability (°C.) | Focal Depth Range Properties | | | |
|---|---|---|---|---|---|---|---|
|  |  |  |  | I(μm) | II(μm) | III(μm) | IV(μm) |
| Example 1 | 380 | 0.38 | 135 | 1.0 | 0.6 | 0.2 | ND |
| Example 2 | 350 | 0.38 | 135 | 1.0 | 0.4 | NFD | ND |
| Example 3 | 370 | 0.38 | 135 | 1.0 | 0.6 | NFD | ND |
| Example 4 | 360 | 0.38 | 135 | 1.0 | 0.6 | NFD | ND |
| Example 5 | 385 | 0.35 | 135 | 1.2 | 0.8 | 0.4 | NFD |
| Comparative Example 1 | 370 | 0.40 | 130 | 1.0 | 0.4 | ND | ND |
| Comparative Example 2 | 370 | 0.40 | 130 | 1.0 | 0.4 | ND | ND |

Notes: ND" means that a resist pattern was not defined, namely, not formed; and NFD" means that a resist pattern was formed but no focal depth range was present.

As is obvious from Table 1, positive photoresist compositions according to the present invention can achieve superior sensitivity, definition, thermostability, and focal depth range properties.

As described above, the photoresist composition of the present invention exhibit excellent sensitivity, definition and thermostability, and in addition, have superior focal depth range properties. Accordingly, they are suitable for manufacture of semiconductor devices, liquid crystal displaying devices, and the like.

While the invention has been described in detail and with reference to specific embodiments thereof, it will be apparent to one of ordinary skill in the art that various changes and modifications can be made therein without departing from the spirit and scope thereof.

What is claimed is:

1. A positive photoresist composition comprising:

(A) an alkali-soluble resin;

(B) a quinonediazide group-containing compound; and (C) at least one hydroxy compound selected from the group consisting of bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, and bis(4-hydroxy-2,3,5-trimethylphenyl)-4-hydroxy-3-methoxyphenylmethane.

2. The positive photoresist composition according to claim 1, wherein said ingredient (B) is an esterified compound of a naphthoquinonediazidesutfonic acid and at least one hydroxy compound selected from the group consisting of bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, and bis(4-hydroxy-2,3,5-trimethylphenyl)-4-hydroxy-3-methoxyphenylmethane.

3. The positive photoresist composition according to claim 2, wherein said ingredient (B) is an esterified compound of a naphthoquinonediazidesulfonic acid and bis(4-hydroxy-2,3,5-trimethylphenyl)-2-hydroxyphenylmethane, and said ingredient (C) is bis(4-hydroxy-2,3,5-trimethylphenyl)-2-hydroxyphenylmethane.

4. The positive photoresist composition according to any one of claims 1 to 3, wherein said ingredient (A) is phenol-novolak resin or cresol-novolak resin.

5. The positive photoresist composition according to any one of claims 1 to 3, wherein said ingredient (A) has a weight average molecular weight of 1,000 to 30,000.

6. The positive photoresist composition according to claim 2, wherein said naphthoquinonediazidesulfonic acid is naphthoquinone-1,2-diazide-4 (or 5)-sulfonic acid.

7. The positive photoresist composition according to claim 1, wherein 1 to 50 parts by weight of said ingredient (B) is combined with 100 parts by weight of the total amount of said ingredients (A) and (C).

8. The positive photoresist composition according to claim 1, wherein 5 to 100 parts by weight of said ingredient (C) is combined with 100 parts by weight of said ingredient (A).

* * * * *